(12) United States Patent
Porter

(10) Patent No.: US 6,266,287 B1
(45) Date of Patent: Jul. 24, 2001

(54) VARIABLE EQUILIBRATE VOLTAGE CIRCUIT FOR PAIRED DIGIT LINES

(75) Inventor: Stephen R. Porter, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/511,471

(22) Filed: Feb. 23, 2000

Related U.S. Application Data

(62) Division of application No. 09/256,125, filed on Feb. 24, 1999, which is a continuation of application No. 08/977,757, filed on Nov. 25, 1997, now Pat. No. 5,903,502.

(51) Int. Cl.[7] .................................................. G11C 7/00
(52) U.S. Cl. ........................ 365/205; 365/202; 365/203; 365/189.11
(58) Field of Search .................................. 365/202, 203, 365/205, 189.11

(56) References Cited

U.S. PATENT DOCUMENTS

| | | | |
|---|---|---|---|
| 4,916,668 | 4/1990 | Matsui | 365/230.01 |
| 4,967,395 | 10/1990 | Watanabe et al. | 365/203 |
| 5,132,575 | 7/1992 | Chern | 307/530 |
| 5,245,578 | 9/1993 | McLaury | 365/203 |
| 5,302,870 | 4/1994 | Chern | 307/530 |
| 5,369,317 | 11/1994 | Casper et al. | 326/87 |
| 5,555,523 | 9/1996 | Haga et al. | 365/203 |
| 5,677,886 | 10/1997 | Seo et al. | 365/203 |
| 5,680,344 | 10/1997 | Seyyedy | 365/145 |
| 5,701,268 | * 12/1997 | Lee et al. | 365/202 X |
| 5,732,033 | 3/1998 | Mullarkey et al. | 365/201 |
| 5,862,089 | 1/1999 | Raad et al. | 365/203 |
| 5,877,993 | 3/1999 | Biegel et al. | 365/201 |
| 5,912,853 | * 6/1999 | Rao | 365/205 |
| 5,991,216 | * 11/1999 | Raad et al. | 365/203 X |
| 6,157,586 | * 12/2000 | Ooishi | 365/205 |

* cited by examiner

*Primary Examiner*—Huan Hoang
(74) *Attorney, Agent, or Firm*—Schwegman, Lundberg, Woessner & Kluth, P.A.

(57) ABSTRACT

A method and circuit for rapidly equilibrating paired digit lines of a memory array of a dynamic random access memory device is described. The equilibrate circuit includes a bias-circuit coupled to sense amplifier circuitry for adjusting the equilibrate voltage during testing. A method is described for testing memory cell margin by adjusting the equilibrate voltage until an error is detected. The bias circuit is described as a pull-up transistor coupled to a common mode of a cross-coupled n-sense amplifier.

20 Claims, 6 Drawing Sheets

VARIABLE EQUILIBRATE VOLTAGE CIRCUIT FOR PAIRED DIGIT LINES

This application is a Divisional of U.S. Ser. No. 09/256,125, filed Feb. 24, 1999, which is a Continuation of Ser. No. 08/977,757 filed Nov. 25, 1997, now U.S. Pat. No. 5,903,502, issued May 11, 1999.

FIELD OF THE INVENTION

The present invention relates to testing of semiconductor memory devices, such as dynamic random access memory devices, and in particular, the invention elates to a method and circuit for adjusting an equilibrate voltage of paired digit lines of a memory device.

BACKGROUND OF THE INVENTION

Semiconductor memory devices, such as dynamic random access memory (DRAM) devices typically store data as a logic one or zero. The data is represented as a charge stored on a capacitor. The charge is shared with a second capacitor, such as a digit line, to produce a resultant voltage. The voltage is then compared to a reference voltage to determine the correct data state. That is, a resultant voltage greater than the reference voltage is a one, and a resultant voltage less than the reference voltage is a zero.

Prior to any memory access cycle, for normal operation of the memory and during testing of the memory, paired digit lines are equilibrated to a common potential typically one-half the supply voltage Vcc. Memory devices include equilibration circuits for this purpose. The equilibration circuit typically comprises one or more transistors that are connected between the digit lines that form a pair of paired digit lines. These transistors are enabled by an equilibrate enable signal that is provided prior to the start of a memory access cycle. When enabled, the transistors short the paired digit lines together. In a differential sensing scheme, the digit lines are charged to opposite supply voltage potentials. Thus, the resultant equilibrate voltage is ½ Vcc.

When testing an integrated circuit memory device it is useful to test memory cell margins, or the amount of voltage a memory cell can move a digit line above an equilibrate voltage. As such, a memory cell with a small margin may result in erroneous data storage. This is particularly true if the memory cell is partially discharged prior to a data read operation. A separate bias voltage can be coupled to a digit line prior to reading data stored in the memory to stress cell margins. This technique is unattractive because of the relative slowness of changing the equilibrate voltage after the standard equilibrate operation is completed.

For the reasons stated above, and for other reasons which will become apparent to those skilled in the art upon reading and understanding the present specification, there is a need in the art for a method and circuit for rapidly equilibrating paired digit lines of a semiconductor memory to a variable voltage, such as during testing.

SUMMARY OF THE INVENTION

The present invention provides a circuit fabricated in an integrated circuit memory device for equilibrating pared digit lines of a memory. The circuit allows the digit lines to be quickly equilibrated to an equilibrate voltage which is different than an equilibrate voltage used during normal memory operations.

In accordance with one embodiment of the invention, there is provided a memory device comprising an array of memory cells arranged in rows and columns, a digit line pair located in the array, and a sense amplifier circuit coupled to the digit line pair for sensing and amplifying a differential voltage between the digit line pair. The memory device also comprises a bias circuit coupled to the sense amplifier circuit for providing a bias voltage to one digit line of the digit line pair during a test operation, and an equilibrate circuit coupled to the digit line pair for equilibrating the digit line pair to a common voltage.

In another embodiment, a Dynamic Random Access Memory comprises an array of memory cells arranged in rows and columns, first and second digit lines arranged as a digit line pair and located in the array, and a sense amplifier circuit coupled to the first and second digit lines for sensing and amplifying a differential voltage between the first and second digit lines. The sense amplifier comprises first and second cross coupled transistors. The first transistor having a drain coupled to the first digit line, a gate coupled to the second digit line, and a source coupled to a source of the second transistor. The second transistor having a drain coupled to the second digit line, and a gate coupled to the first digit line. A pull-up transistor is coupled between the source of the second transistor and a bias voltage, the pull-up transistor controlled by an activate signal coupled to its gate. An equilibrate circuit is coupled to the digit line pair for equilibrating the first and second digit lines to a common equilibrate voltage.

In yet another embodiment, a method of equilibrating a memory device during a test mode is described. The method comprises the steps of initiating a test mode, accessing a memory cell for either reading from or writing data to the memory cell, and activating sense amplifier circuitry. The sense amplifier detects a differential voltage between complementary digit lines, and drives a first digit line to a high voltage and a second digit line to a low voltage. The method further comprises isolating the memory cell, activating a bias circuit to raise the second digit line voltage, and coupling the complementary digit lines together to equilibrate the first and second digit lines to a common test equilibrate voltage.

A method of testing memory cell margin in a memory device is also described. The method comprises the steps of equilibrating first and second digit lines to a first level, reading data stored in a memory cell, and restoring the data to a memory cell. The first and second digit lines are equilibrated to a second level which is greater than the first level via a bias circuit and sense amplifier. The steps of re-reading the data stored in the memory cell, and equilibrating the first and second digit lines to successively higher equilibrate voltages until a data read error is detected are also included in the method.

DESCRIPTION OF THE PREFERRED EMBODIMENT

In the following detailed description of the preferred embodiment, reference is made to the accompanying drawings which form a part hereof, and in which is shown by way of illustration a specific preferred embodiment in which the invention may be practiced. The preferred embodiment is described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the appended claims.

Figure 1:
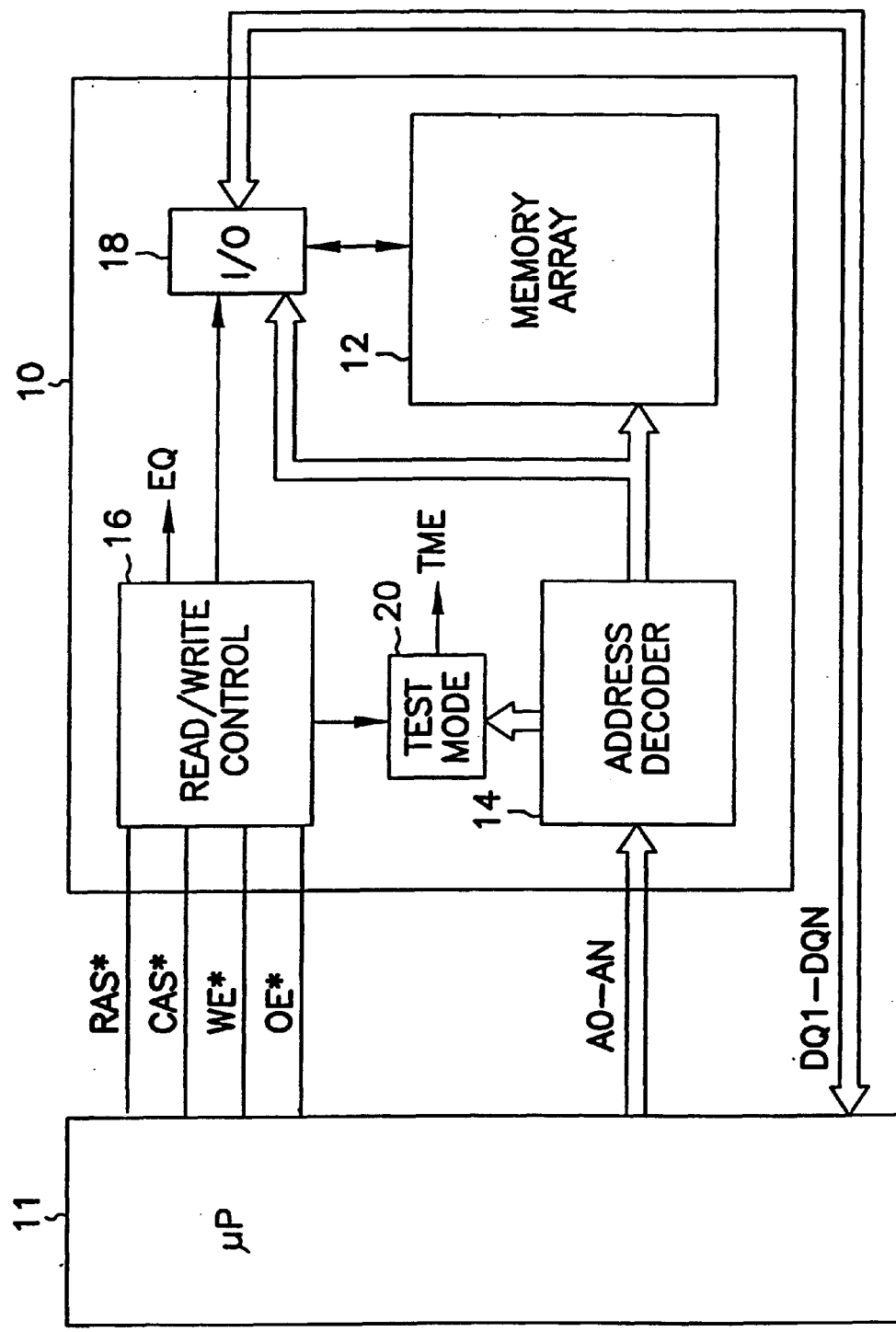
FIG. 1 is a simplified representation of a semiconductor memory device incorporating the present invention.

FIG. 1 is a simplified representation of a semiconductor memory device 10 incorporating the present invention. In one embodiment, the semiconductor memory device 10 is a dynamic random access memory (DRAM). However, the invention can be incorporated into other semiconductor memory devices. The basic memory device 10 is well known in the art to include a memory array 12, address decoder circuits 14, read/write control circuits 16 and input/output circuits 18. The memory device 10 additionally includes a test mode circuit 20 for enabling a plurality of tests to be conducted on the memory device. It will be appreciated that the memory has been simplified to focus on the features of the present invention, and all the features of the memory have not been shown. A microprocessor, or memory controller can be coupled to the memory for providing control signals, address signals and bi-directional data communication signals.

The test mode circuit allows the memory to be evaluated using a wide variety of tests. These tests can be conducted during fabrication of the memory, or after the memory has been completed. The test mode can be initiated using any known techniques, including, but not limited to, an electronic key, supervoltages, specific combinations of control and address signals, or probe points. While an almost unlimited number of tests are available, testing of memory cell margins are particularly benefited by the present invention, as explained in greater detail below.

Figure 2:
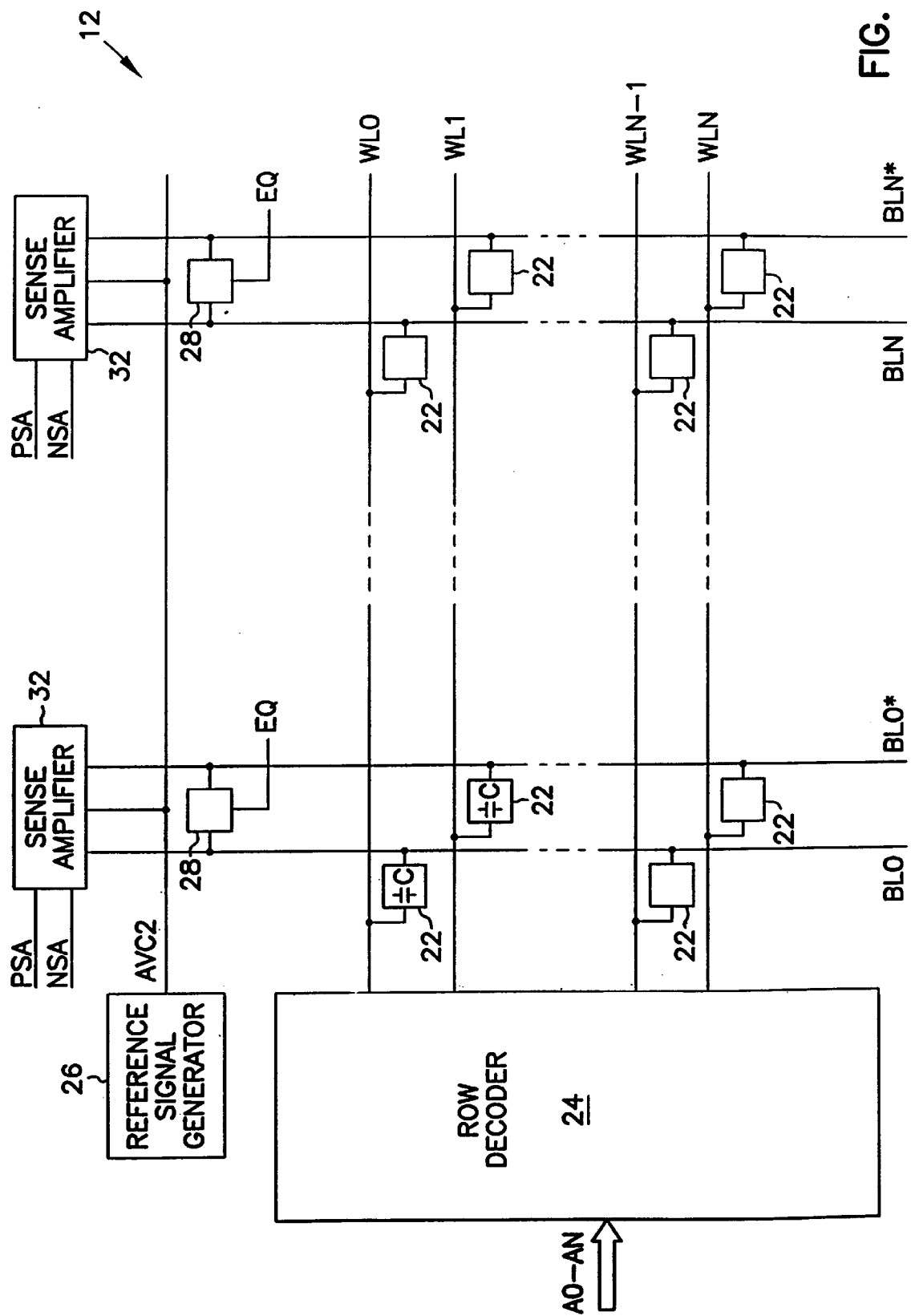
FIG. 2 is a simplified representation of the memory array and a portion of the memory array access circuitry for the memory device of FIG. 1.

Referring to FIG. 2, the memory array 12 is constructed of a plurality of memory cells 22 arranged in a matrix and having inputs and outputs corresponding to the rows and the columns of the array. The array has differential paired digit (data) lines BL0, BL0* ... BLN, BLN* and word (address) lines WL0, WL1 ... WLN–1, WLN. The paired digit lilies BL0, BL0* ... BLN, BLN* are used to write information into the memory cell and to read data stored in the memory cell. Each of the paired digit lines includes a true state digit line, such as digit line BL0, and a complementary digit line, such as digit line BL0*. The word lines WL0, WL1 ... WLN–1, WLN are used to address or select the memory cell to which data is to be written or read.

The address decoder circuits 14 include row decoder circuits 24 which control word line drivers to access the memory cells of the memory array 12 in response to address signals A0–AN that are provided by an external controller, such as a microprocessor. The address decoder circuit 14 also includes bit line drivers and column decoder circuits for selecting the bit lines. The input/output circuits 18 and other circuits, such as buffers which control either synchronous or asynchronous data communication between the memory device 10 and external devices in the conventional manner.

A reference signal generating circuit 26 functions as a source of a pre-charge or equilibrating voltage AVC2 which can be applied to the digit lines by sense amplifiers 32. A separate equilibration circuit 28 is provided for each of the paired digit lines, such as paired digit lines BL0 and BL0*, and is connected between the associated paired digit lined to equilibrate the potentials of paired digit lines. The sense amplifiers 32 are connected to each of the paired digit lines, such as BL0 and BL0*. The sense amplifiers 32 can include n-sense and p-sense amplifier circuits, as is known to one skilled in the art.

Memory Cell and Operation

Figure 3:
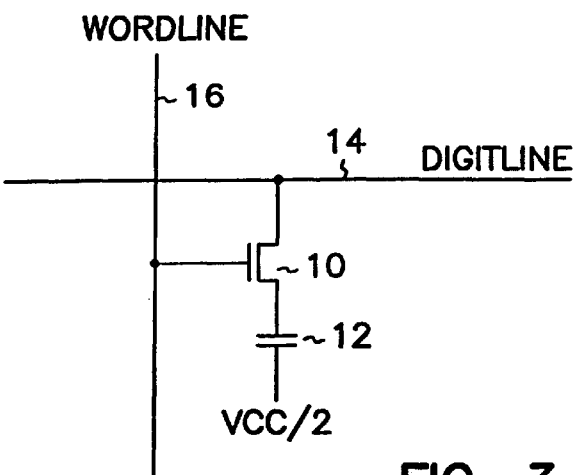
FIG. 3 is a schematic diagram of a memory cell.

A DRAM memory cell or memory bit, as shown in FIG. 3, consists of one MOS transistor 10 and one storage capacitor 12—accordingly referred to as a one-transistor one-capacitor (1T1C) cell. The memory bit transistor operates as a switch, interposed between the memory bit capacitor and the digit line 14. The memory bit is capable of holding a single piece of binary information, as stored electric charge in the cell capacitor. Given a bias voltage of Vcc/2 on the capacitor's common node, a logic one level is represented by +Vcc/2 volts across the capacitor and a logic zero is represented by –Vcc/2 volts across the capacitor.

The digit line, as depicted in FIG. 3, consists of a conductive line connected to a multitude of memory bit transistors. Generally, either metal of silicided/polycided polysilicon forms the conductive line. Due to the large quantity of attached memory bits, its physical length, and proximity to other features, the digit line is very capacitive. For instance, a typical value for digit line capacitance on a 0.35 um process might be around 300 fF. Digit line capacitance is an important parameter since it dictates many other aspects of the design.

The memory bit transistor's gate terminal connects to a word line (Row line) 16. The word line, which connects to a multitude of memory bits, consists of an extended segment of the same polysilicon used to form the transistor's gate. The word line is physically orthogonal to the digit line. A memory array, shown in FIG. 4, is created by tiling a selected quantity of memory bits together such that memory bits along a given digit line do not share a common word line and such that memory bits along a common word line do not share a common digit line.

Figure 4:
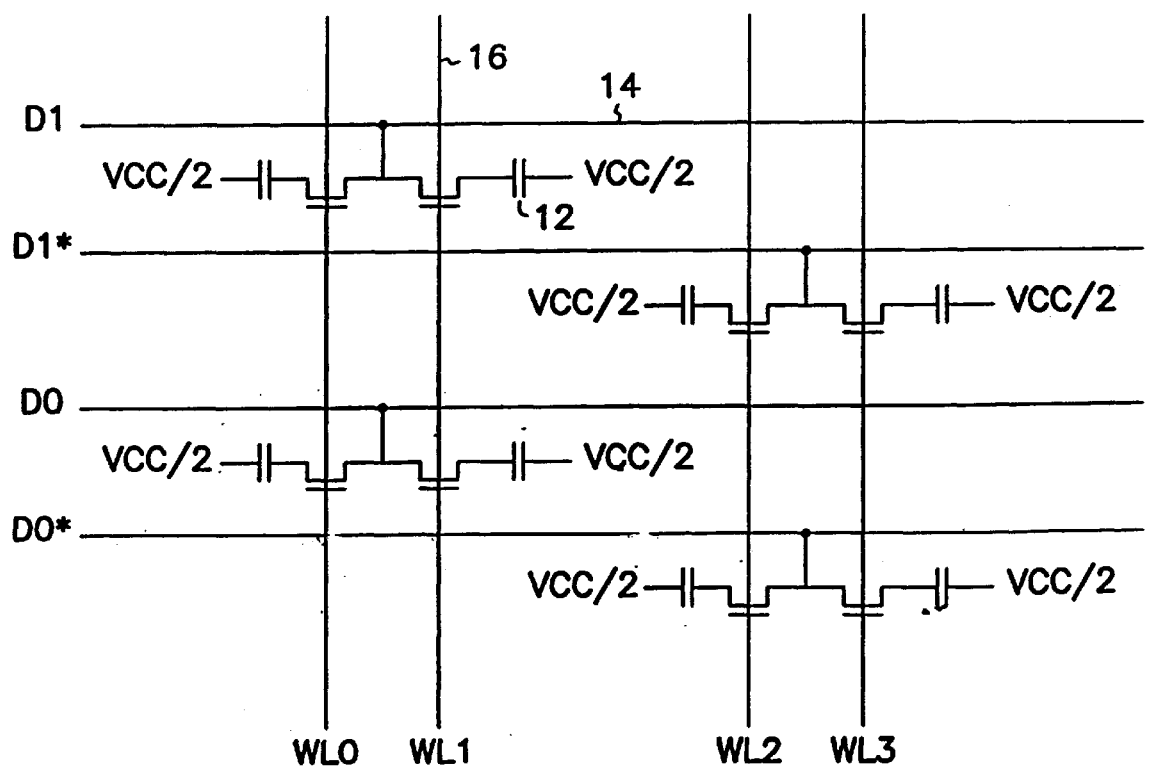
FIG. 4 is a schematic diagram of the memory array of FIG. 1.
Figure 5:
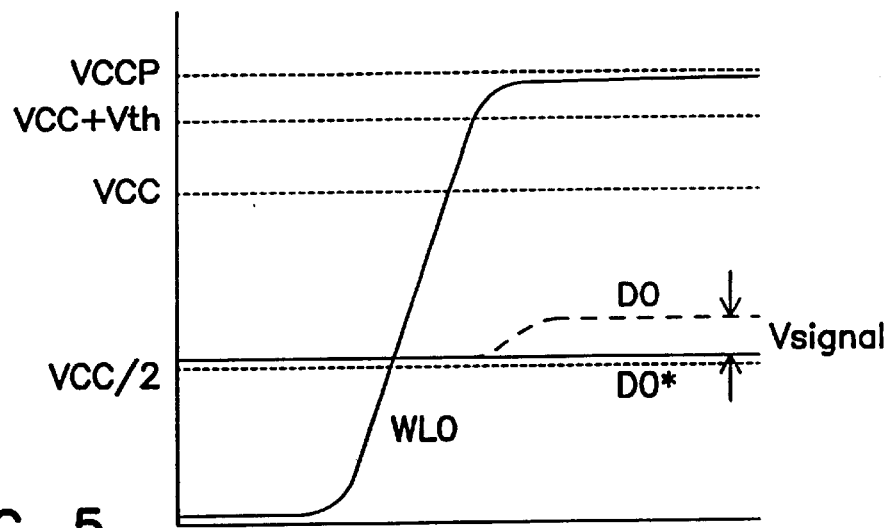
FIG. 5 is a timing diagram of a memory cell access operation.

Referring to FIG. 4, assume that the capacitor has a logic one level (+Vcc/2) stored on it. The digit lines, labeled D0 and D0* are initially equilibrated at Vcc/2 volts. All word lines are initially at zero volts, which turns off the memory bit transistors. To read memory bitl, word line WL0 transitions to a voltage that is at least one tansistor $V_{th}$ above Vcc. This elevated word line voltage level is referred to as Vccp or Vpp. When the word line voltage exceeds one $V_{th}$ above the digit line voltage (Vcc/2 in this example) and the memory bit transistor turns on, the memory bit capacitor will begin to discharge onto the digit line. Essentially, reading or accessing a DRAM cell results in charge sharing between the memory bit capacitor and the digit line capacitance. This sharing of charge causes the digit line voltage to either increase for a stored logic one or decrease for a stored logic zero. A differential voltage develops between the two digit lines. The magnitude of this signal voltage is a function of the memory bit-capacitance (C memory bit), digit line capacitance (Cdigit), the memory bit's stored voltage prior to the access. (Vcell), and any noise terms. For a design in which Vcell=1.65 V, Cmemory bit=40 fF, Cdigit=300 fF, and $V_{noise}$=0, this yields a digit line change of $V_{signal}$=194 mV. FIG. 5 contains waveforms for the cell access operation just described.

Figure 6:
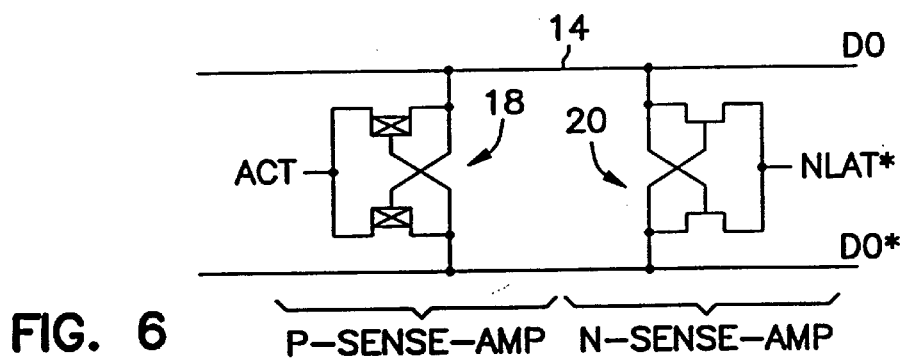
FIG. 6 is a schematic diagram of a typical sense amplifier circuit.
Figure 7:
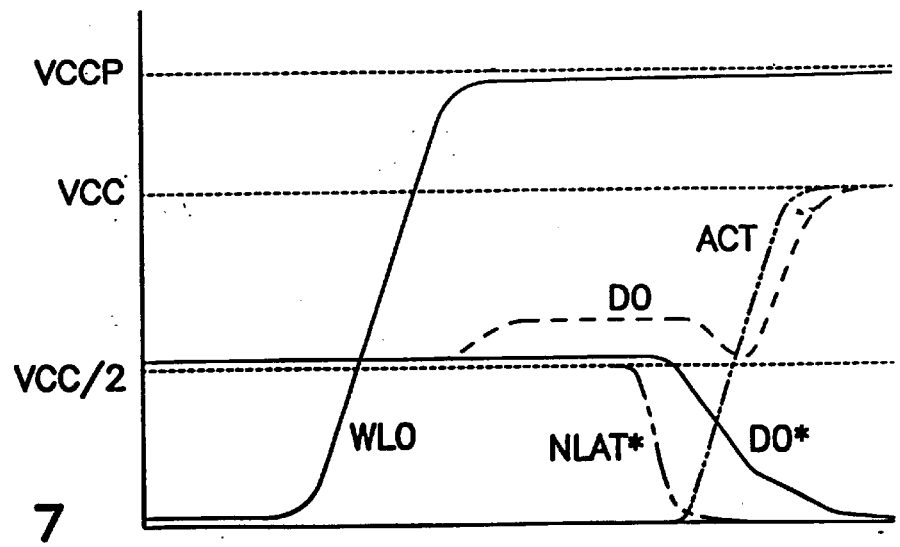
FIG. 7 is a timing diagram of the operation of the sense amplifier circuit of FIG. 6.

After the cell access is complete, the sensing operation can commence. The reason for forming a digit line pair will now become apparent. FIG. 6 contains a schematic diagram for a simplified typical sense amplifier circuit. Note that it consists of a cross-coupled PMOS pair 18 and a cross-coupled NMOS pair 20. The NMOS pair or N-sense-amp common node is labeled NLAT* (for N-sense-amp LATch) in FIG. 5. Similarly, the P-sense-amp common node is labeled ACT (for ACTive pull-up). Initially, NLAT* is biased to Vcc/2 and ACT is biased to VSS or ground. Since the digit line pair D0 and D0* are both initially at Vcc/2 volts, the N-sense-amp transistors remain off due to zero Vgs potential. Similarly, both P-sense-amp transistors remain off due to their negative Vgs potential. As discussed in the preceding paragraph, a signal voltage develops between the digit line pair when the memory bit access occurs. While one digit line contains charge from the cell access, the other digit line serves as a reference for the sensing operation. The sense amplifier firing generally occurs sequentially rather than concurrently. The N-sense-amp fires first and the P-sense-amp second. The N-sense-amp is generally a better amplifier than the P-sense-amp because of the higher drive of NMOS transistors and better $V_{th}$ matching. This provides for better sensing characteristics and lower probability of ears. FIG. 7 contains waveforms for the sensing operation. Dropping the NLAT* signal toward ground will fire the N-sense-amp. As the voltage between NLAT* and the digit lines approaches $V_{th}$, the NMOS transistor, whose gate connection is to the higher voltage digit line, will begin to conduct. Conduction results in the discharge of the low voltage digit line toward the NLAT* voltage. Ultimately, NLAT* will reach ground, bringing the digit line with it. Note that the other NMOS transistor will not conduct since its gate voltage derives from the low voltage digit line, which is discharging toward ground.

Shortly after the N-sense-amp fires, ACT will be drive toward Vcc. This activates the P-sense-amp that operates in a complementary fashion to the N-sense-amp. With the low voltage digit line approaching ground, a strong signal exists to drive the appropriate PMOS tansistor into conduction. This will charge the high voltage digit line toward ACT, ultimately reaching Vcc. Since the memory bit transistor remains on during sensing, the memory bit capacitor will charge to the NLAT* or ACT voltage level. The voltage, and hence charge, which the memory bit capacitor held prior to accessing will restore a full level—Vcc for a logic one and GND for a logic zero.

For a memory write operation, the paired digit lines are charged to represent the data to be written into the memory cell. The word line WL0 is activated for connecting the memory cell to the digit line BL0 to allow charge sharing between the digit line and the capacitor C of the memory cell. It will be appreciated the memory read/write operations have been described in a simplified manner and that such access operations include numerous additional steps known to those skilled in the art.

Variable Equilibrate Circuit

Figure 8:
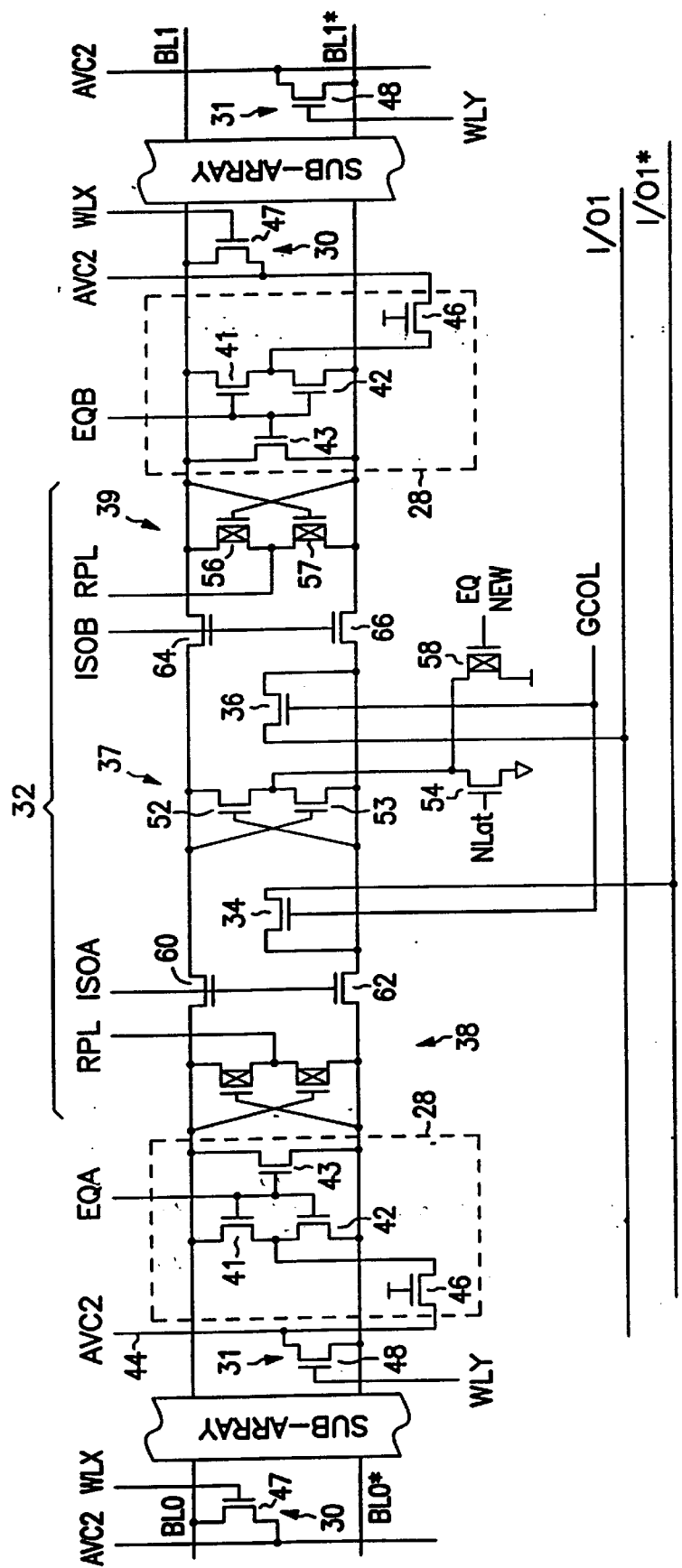
FIG. 8 is a more detailed schematic of a portion of the array of FIG. 1.

Referring to FIG. 8, the equilibration circuit 28 of the present invention can include n-channel transistors 41 and 42 which are connected in series between the complementary digit lines BL0 and BL0*, and a further n-channel transistor 43 that is connected between the complementary digit lines BL0 and BL0* and in parallel with transistors 41 and 42. The gate electrodes of transistors 41, 42 and 43 are commonly connected to receive an equilibration enabling signal EQA that is produced by the read/write control circuits 16. It is pointed out that the read/write control circuits 16 produce separate equilibrating signals EQA and EQB, with signal EQA being applied to the equilibrating circuit associated with subarray 33A and the equilibrating signal EQB being applied to the equilibrating circuit associated with subarray 33B.

The n-sense amplifier circuit 37 can be comprised of a pair of cross-coupled, n-channel transistors 52 and 53. The source electrodes of transistors 52 and 53 are connected to a pulldown transistor 54 which is activated by signal NLAT. The NLAT line is strobed high to sense data stored on a selected memory cell. Similarly, each p-sense amplifier circuit, such as sense amplifier circuit 39, is comprised of a pair of cross-coupled, p-channel transistors 56 and 57. The source electrodes of the p-channel transistors 56 and 57 are connected to a common enable line RPL which is normally held to Vcc/2 and is strobed high to sense data stored on the memory cells.

The source electrodes of transistors 52 and 53 are also coupled to pull-up transistor 58. During test operations transistor 54 is activated to sense a differential voltage between the digit lines. After the memory cells are isolated from the digit lines, transistor 58 is activated to raise the voltage on the digit line. When the digit lines are equilibrated, therefore, the resultant equilibrate voltage is greater than the normal equilibrate voltage, such as Vcc/2.

Figure 9:
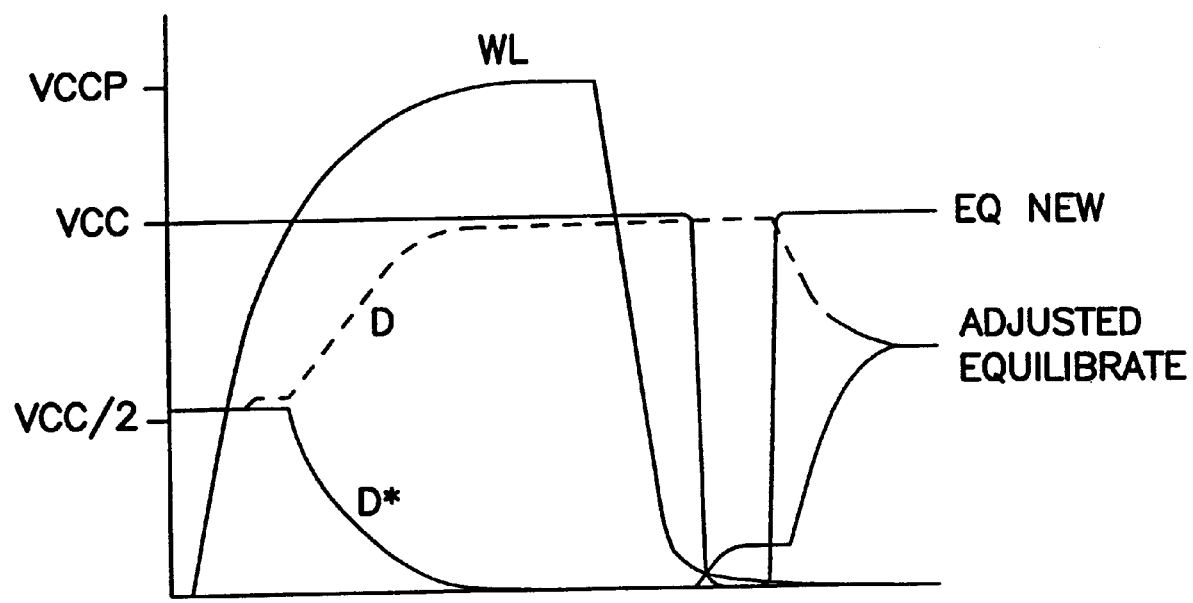
FIG. 9 is timing a diagram illustrating waveforms for the equilibration circuit of FIG. 8 provided by the invention.

FIG. 9 illustrates the timing of the operation of transistor 58 following a data read. At time T1, the digit lines have been equilibrated to Vcc/2. A word line signal is then raised to couple a memory cell to a digit line. A differential voltage develops across the digit lines when the memory cell is accessed, as illustrated. The sense amplifiers are activated (not shown) to drive the digit lines to opposite power supply potentials. Note that the word lines remains active at an elevated voltage to restore the data to the memory cell. After the data is restored, the word line is lowered to isolate the memory cell The EQNEW signal transitions low to activate transistor 58. Thus, the low digit line is charged through transistor 58 an the n-sense amplifier. When the EQNEW signal returns to a high state, the equilibration circuitry is activated. The new equilibrate level, therefore, is about equal to the average of the two digit line voltages and is greater than the normal operational level of Vcc/2. The low pulse width of the EQNEW signal can be adjusted to control the level of charge provided to the low digit line. It will be appreciated by those skilled in the art that the equilibrate voltage can be reduced in the same manner by lowering the high digit line prior to equilibration. By adjusting the equilibrate voltage level, cell margin can be tested. That is, by systematically raising the equilibrate voltage the point where a memory cell fails to provide enough digit line signal for accurate sense amplifier detection can be established.

Conclusion

A memory has been described which includes a bias circuit coupled to a sense amplifier for adjusting a digit line voltage prior to equilibration. The bias circuit is described as a pull-up transistor coupled to the n-sense amplifier circuit. A method has been described for testing cell margin in a DRAM by raising the equilibrate voltage until data stored in a memory cell is erroneously read. The equilibrate voltage is adjusted by controlling a pulse width of the pull-up transistors gate signal.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A memory device comprising:
   a memory cell;
   a pair of digit lines coupled to the memory cell;
   a sense amplifier comprising an n-sense amplifier having a common source electrode, the n-sense amplifier being coupled to the memory cell;
   a separate transistor equilibration circuit provided for each of the pair of digit lines; and
   a bias circuit comprising a pull-up transistor coupled to the common source electrode and a pull-down transistor coupled to the common source electrode, the sense amplifier for adjusting a digit line voltage prior to equilibration.

2. A method of operating a memory device comprising:
   equilibrating a pair of digit lines to a value of Vcc/2;
   coupling a digit line to a controllable charge source capable of providing a level of charge to the digit line;
   adjusting a pulse width provided to the controllable charge source to control the level of charge provided to at least one of the pair of digit lines;
   raising a word line signal to couple a memory cell to the pair of digit lines;
   activating a sense amplifier to drive each of the pair of digit lines to opposite power supply potentials;
   lowering the word line to isolate the memory cell;
   driving a signal low to charge at least one of the pair of digit lines; and
   driving a signal high to activate the equilibration circuitry.

3. A computer system comprising:
   a processor;
   a memory board coupled to the processor; and
   a system for equilibrating a digit line coupled to the memory board, and the system comprising:
      a reference signal generating circuit capable of generating a plurality of reference signals; and
      a sense amplifier having a common source electrode, the common source electrode being coupled to the reference signal generating circuit.

4. A computer system comprising:
   a processor;
   a memory coupled to the processor; and
   a memory device incorporated in the memory system, and the memory device comprising:
      a memory cell;
      a sense amplifier having a common source electrode, the sense amplifier being coupled to the memory cell; and
      a bias circuit comprising a pull-up transistor and a pull-down transistor coupled to the common source electrode, the bias circuit being coupled to the sense amplifier for adjusting a digit line voltage prior to equilibration.

5. The computer system of claim 4, wherein the bias circuit comprises an n-channel transistor.

6. The computer system of claim 4, wherein the sense amplifier is an n-sense amplifier.

7. A computer system comprising:
   a processor; and
   a memory coupled to the processor, the memory comprising:
      a memory cell;
      a pair of digit lines coupled to the memory cell;
      a sense amplifier comprising an n-sense amplifier having a common source electrode, the n-sense amplifier being coupled to the memory cell;
      a separate transistor equilibration circuit provided for each of the pair of digit lines; and
      a bias circuit comprising a pull-up transistor coupled to the common source electrode and a pull-down transistor coupled to the common source electrode, the sense amplifier for adjusting a digit line voltage prior to equilibration.

8. The computer system of claim 7, wherein the pull-up transistor is an n-channel transistor.

9. The computer system of claim 8, wherein the pull-down transistor is an n-channel transistor.

10. A memory device comprising:
    a memory cell;
    a sense amplifier comprising an n-sense amplifier having a common source electrode, the n-sense amplifier being coupled to the memory cell; and
    a bias circuit comprising a pull-up transistor coupled to the common source electrode and a pull-down transistor coupled to the common source electrode, the sense amplifier for adjusting a digit line voltage prior to equilibration.

11. The memory device of claim 10, wherein the sense amplifier comprises two transistors.

12. The memory device of claim 10, wherein the pull-up transistor is an n-channel transistor and the pull-down transistor is a p-channel transistor.

13. A computer system comprising:
    a processor; and
    a memory device coupled to the processor, the memory device comprising:
       a memory cell;
       a sense amplifier comprising an n-sense amplifier having a common source electrode, the n-sense amplifier being coupled to the memory cell; and
       a bias circuit comprising a pull-up transistor coupled to the common source electrode and a pull-down transistor coupled to the common source electrode, the sense amplifier for adjusting a digit line voltage prior to equilibration.

14. The computer system of claim 13, wherein the pull-up transistor comprises an n-channel transistor coupled to a positive potential.

15. The computer system of claim 14, wherein the pull-down transistor comprises a p-channel transistor coupled to a zero potential.

16. A method of controlling charge in a memory device, the method comprising:
    equilibrating a pair of digit lines to a value of $V_{cc}/2$;
    coupling a digit line to a controllable charge source capable of providing a level of charge to the pair of digit lines; and adjusting a pulse width provided to the controllable charge source to control the level of charge provided to at least one of the pair of digit lines.

17. The method of claim 16, wherein adjusting a pulse width provided to the controllable charge source to control the level of charge provided to at least one of the pair of digit lines comprises increasing pulse width.

18. The method of claim 16, wherein adjusting a pulse width provided to the controllable charge source to control the level of charge provided to at least one of the pair of digit lines comprises decreasing pulse width.

19. A memory device comprising:

a dynamic random access memory cell;

a sense amplifier comprising an n-sense amplifier having a common source electrode, the n-sense amplifier being coupled to the dynamic random access memory cell; and a bias circuit comprising a pull-up transistor coupled to the common source electrode and a pull-down transistor coupled to the common source electrode, the sense amplifier for adjusting a digit line voltage prior to equilibration.

20. The memory device of claim 19, wherein the sense amplifier comprises a pair of serially connected n-channel transistors.

* * * * *

UNITED STATES PATENT AND TRADEMARK OFFICE
CERTIFICATE OF CORRECTION

PATENT NO.   : 6,266,287 B1
DATED        : July 24, 2001
INVENTOR(S)  : Porter

Page 1 of 1

It is certified that error appears in the above-identified patent and that said Letters Patent is hereby corrected as shown below:

Column 1,
Line 13, delete "elates" and insert -- relates --, therefor.

Column 4,
Line 5, delete "data communication" and insert -- data, communicate --, therefor.
Line 12, delete "lined" and insert -- lines --, therefor.
Line 56, delete "bitl" and insert -- bit1 --, therefor.

Column 5,
Line 4, delete "access." and insert -- access --, therefor.
Line 43, delete "drive" and insert -- driven --, therefor.
Line 60, after "appreciated" insert -- that --.

Column 6,
Line 27, delete "operations" and insert -- operations, --, therefor.
Line 42, delete "remains" and insert -- remain --, therefor.
Line 45, delete "cell The" and insert -- cell. The --, therefor.
Line 47, delete "an" and insert -- and --, therefor.
Line 58, delete "voltage" and insert -- voltage, --, therefor.

Signed and Sealed this

Sixteenth Day of April, 2002

*Attest:*

JAMES E. ROGAN
*Director of the United States Patent and Trademark Office*

*Attesting Officer*